United States Patent
Ikeda et al.

(10) Patent No.: US 6,940,140 B1
(45) Date of Patent: Sep. 6, 2005

(54) PACKAGE STRUCTURE OF SOLID-STATE IMAGE SENSOR

(75) Inventors: Kenji Ikeda, Gifu-ken (JP); Kazuhiko Takeno, Ogaki (JP); Yasuhiro Asano, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 823 days.

(21) Appl. No.: 09/691,420

(22) Filed: Oct. 17, 2000

(30) Foreign Application Priority Data

Oct. 19, 1999 (JP) ............................................ 11-296719

(51) Int. Cl.[7] .............................................. H01L 21/76
(52) U.S. Cl. ...................................................... 257/433
(58) Field of Search ................................. 257/704, 749, 257/787, 788, 789, 433; 438/64, 72

(56) References Cited

U.S. PATENT DOCUMENTS

| | | | | |
|---|---|---|---|---|
| 4,418,284 A | * | 11/1983 | Ogawa et al. | 250/208.1 |
| 4,523,102 A | * | 6/1985 | Kazufumi et al. | 250/208.1 |
| 4,710,797 A | * | 12/1987 | Tanaka | 257/681 |
| 4,745,470 A | * | 5/1988 | Yabe et al. | 348/76 |
| 4,801,998 A | * | 1/1989 | Okuaki | 257/681 |
| 4,827,118 A | * | 5/1989 | Shibata et al. | 257/432 |
| 5,138,145 A | * | 8/1992 | Nakamura et al. | 250/208.1 |
| 5,405,809 A | * | 4/1995 | Nakamura et al. | 438/64 |
| 5,408,121 A | * | 4/1995 | Nakamura et al. | 257/433 |
| 5,949,073 A | * | 9/1999 | Shimoyama | 250/338.4 |
| 6,268,654 B1 | * | 7/2001 | Glenn et al. | 257/704 |

FOREIGN PATENT DOCUMENTS

| | | | |
|---|---|---|---|
| JP | 404010445 A | * | 1/1992 |
| JP | 05-090549 | | 4/1993 |
| JP | 05-218230 | | 8/1993 |
| JP | 05-343655 | | 12/1993 |
| JP | 405343655 A | * | 12/1993 |

* cited by examiner

*Primary Examiner*—David A. Zarneke
(74) *Attorney, Agent, or Firm*—Sheridan Ross PC

(57) ABSTRACT

A package structure of a solid-state image sensor having a solid-state image sensor chip and a color filter stuck on a light receiving surface of the chip. The package structure includes a vessel for packaging the solid-state image sensor chip. An optically transparent protection plate is attached to the vessel to cover the light receiving surface of the chip. A resin layer is arranged between the chip and the protection plate to absorb light having a predetermined wavelength.

5 Claims, 2 Drawing Sheets

PACKAGE STRUCTURE OF SOLID-STATE IMAGE SENSOR

BACKGROUND OF THE INVENTION

The present invention relates to a package structure for a color solid-state image sensor to which a color filter is applied.

FIG. 1 is a cross-sectional view showing a prior art package structure of a solid-state image sensor.

A ceramic vessel 1 has a cavity 2 for receiving a solid-state image sensor chip 3. The chip 3 is fixed to the bottom surface of the cavity 2 by a bonding paste 4. The chip 3 has a light receiving surface on which a plurality of light receiving pixels are arranged in a matrix-like manner. A color filter 9, which associates each of the light receiving pixels with a predetermined color component, is stuck on the light receiving surface to enable color imaging. A plurality of leads are embedded in the vessel 1. One end 6 of each lead is exposed in the cavity 2, while the other end of each lead is exposed at the outer surface of the vessel 1. Each lead end 6 exposed in the cavity 2 is connected to the chip 3 by a wire 5. A transparent glass plate 7 seals the chip 3 in the vessel 1.

The color filter 9 is an organic resin film that covers each light receiving pixel of the chip 3. The resin film is stuck on the surface of the chip 3 and then, in correspondence with each pixel, colored to a predetermined color. When exposed to light, such as sunlight, over a long period of time, the color filter 9 may discolor or face. This restricts the environment in which the solid-state image sensor may be used.

SUMMARY OF THE INVENTION

It is an object of the present invention to provide a package structure of a solid-state image sensor that prevents discoloring or fading of the color filter.

To achieve the above object, the present invention provides a package structure of a solid-state image sensor having a solid-state image sensor chip and a color filter stuck on a light receiving surface of the chip. The package structure includes a vessel for packaging the solid-state image sensor chip. An optically transparent protection plate is attached to the vessel to cover the light receiving surface of the chip. A resin layer is arranged between the chip and the protection plate to absorb light having a predetermined wavelength.

A further aspect of the present invention provides a solid-state image sensor including a solid state image sensor chip, which has a light receiving surface and a color filter stuck on the light receiving surface. The device also has a vessel including a cavity for receiving the chip. A resin layer is arranged in the cavity to cover the color filter. The resin layer absorbs light having a predetermined wavelength. A protection plate is attached to the vessel to cover at least part of the resin layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 1:
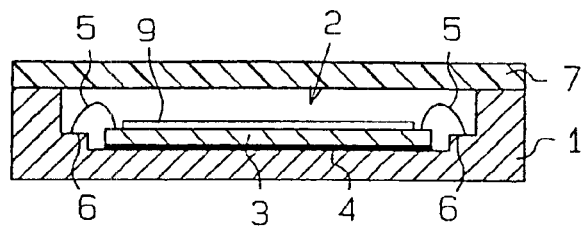
FIG. 1 is a schematic cross-sectional view showing a prior art package structure of a solid-state image sensor.

A package structure of a solid-state image sensor according to a preferred embodiment of the present invention will now be described with reference to FIGS. 2 to 4. A solid-state image sensor chip 13, to which a color filter 19 is applied, is fixed to a vessel 11 at the bottom surface of a cavity 12 by a bonding paste 14. The vessel 11 and the chip 13 are respectively identical to the conventional vessel 1 and chip 3 shown in FIG. 1. Lead ends 16a are connected to the chip 13 with wires 15.

A resin layer 17, which mainly absorbs ultraviolet light and transmits visible light, is formed in the cavity 12. More specifically, a transparent resin is put in the cavity 12 with the chip 13. A glass plate 18 is then attached to the vessel 11 to cover the resin. This forms the transparent resin layer 17 between the chip 13 and the glass plate 18.

The resin layer 17 absorbs light having a shorter wavelength, such as ultraviolet light, and transmits light in the visible light band. More specifically, the preferred material is one that transmits light having a wavelength of 380 nm to 780 nm and absorbs light having a wavelength of 380 nm or less. The preferred embodiment employs an acrylic transparent resin manufactured by Kyouritsu Kagaku Kabushiki Kaisha (product number XLV-14SG2) as the transparent resin.

Figure 3:
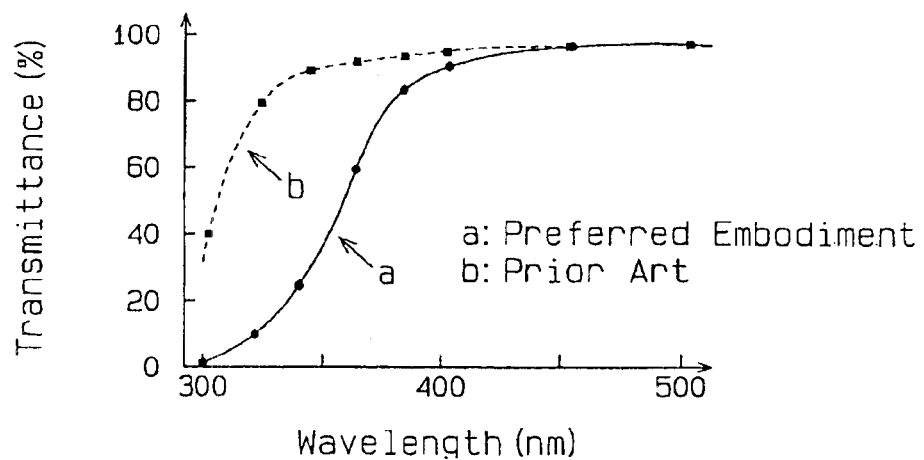
FIG. 3 is a graph showing the relationship between the wavelength of a light irradiated against a chip and the transmittance.

FIG. 3 is a graph illustrating the wavelength of the light that reaches the light receiving surface of the chip 13. In the graph, curve a represents the transmittance of light in the preferred embodiment, which uses the resin layer 17, and curve b represents the transmittance of light in the prior art device. The glass plate 18 and the resin layer 17 each have a thickness of about one millimeter.

In the preferred embodiment (curve a), light having a wavelength shorter than visible light (wavelength being 380 nm or less) is effectively absorbed by the resin layer 17 and substantially does not reach the light receiving surface of the chip 13. In the prior art (curve b) in which the resin layer 17 is not employed, light having a wavelength of 380 nm or less, and especially, 350 nm or less, reaches the light receiving surface of the chip 3 at almost the same level as visible light. Accordingly, the effectiveness of the resin layer 17 to filter light is apparent.

Figure 4:
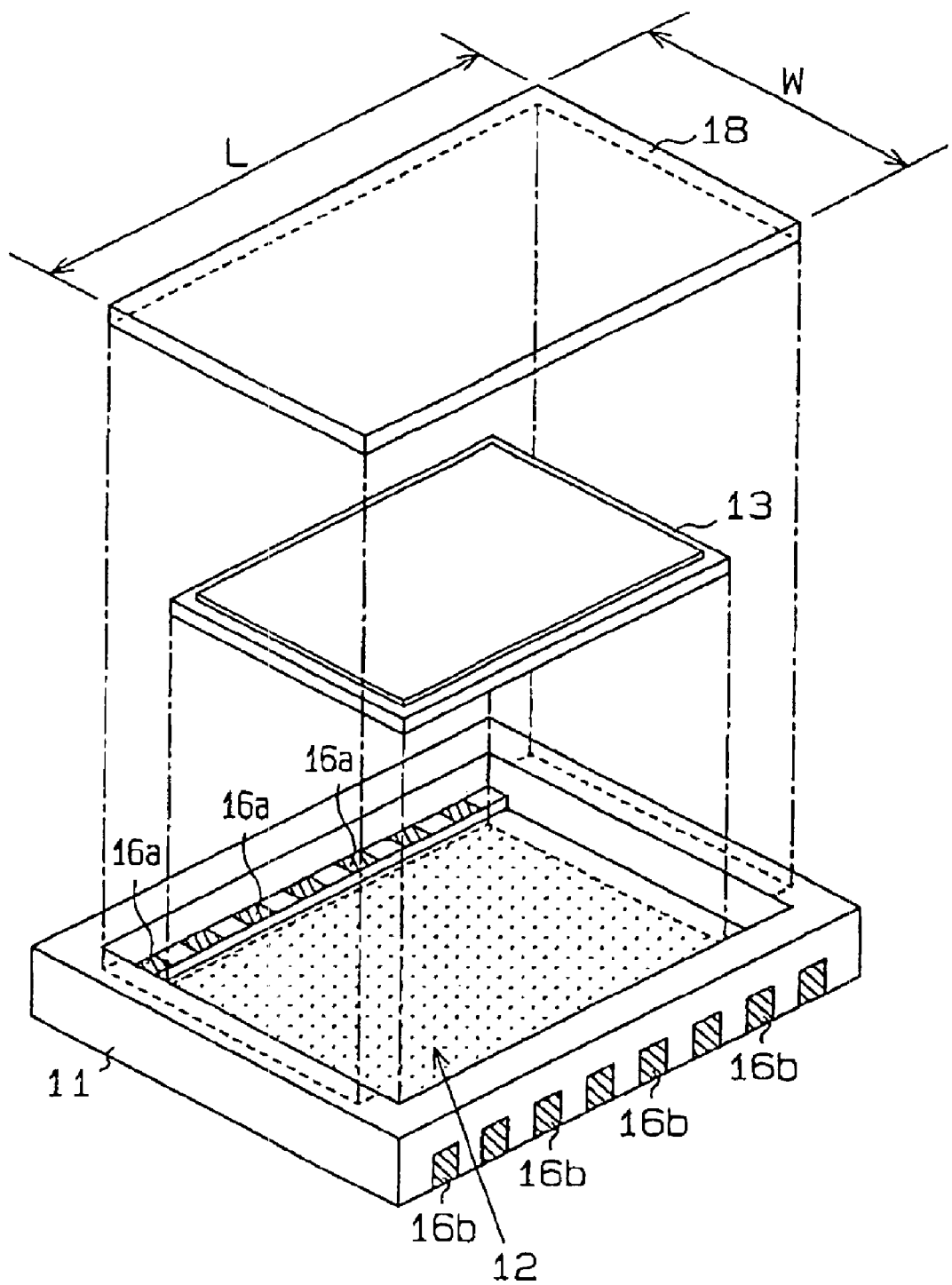
FIG. 4 is an exploded perspective view showing the package structure of FIG. 2.

As shown in FIG. 4, the length L of the glass plate 18 is greater than that of the cavity 12 and the width W of the glass plate 18 is less than that of the cavity 12. Thus, when the glass plate 18 is attached to the vessel 11, a gap is formed between the glass plate 18 and the cavity 12 on each side of the glass plate 18. The gaps serve to decrease internal stress that is produced when the resin layer 17 contracts or expands. The width W of the glass plate 18 is at least wider than the light receiving surface of the chip 13.

Figure 2:
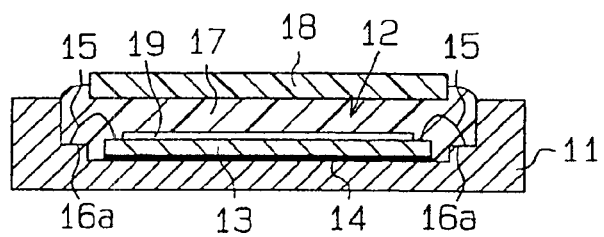
FIG. 2 is a schematic cross-sectional view showing a package structure of a solid-state image sensor according to a preferred embodiment of the present invention.

Except for the glass plate 18, the package structure of the preferred embodiment is substantially the same as that of the prior art shown in FIG. 1. This enables the package structure of the preferred embodiment to be handled in the same manner as the conventional solid-state image sensor.

The color filter 19 is protected in the solid-state image sensor of the preferred embodiment. Thus, the solid-state image sensor of the preferred embodiment may be used in a wide variety of environments.

With reference to FIG. 4, a method for fabricating the package structure of FIG. 2 will now be discussed.

The vessel 11 accommodates the chip 13 in the cavity 12. A plurality of leads are embedded in the vessel 11. The end 16a of each lead is exposed in the cavity 12. The other end 16b of each lead is exposed at the outer surface of the vessel 11 to serve as a terminal connected to an external circuit.

The chip 13, which is fabricated through a predetermined fabrication process, is fixed to the bottom surface of the cavity 12 by the bonding paste 14. Then, a plurality of bonding pads (not shown) formed at the ends of the chip 13 and the lead ends 16a exposed in the cavity 12 are electrically connected by wires 15 (e.g., gold wires). Next, a fluxional transparent resin is charged into the cavity 12. The amount of transparent resin is controlled such that the resin covers the chip 13 and the wires 15 but does not flow out of the cavity 12. Before the resin hardens, the surface of the resin, or the cavity 12, is covered by the glass plate 18. The width W of the glass plate 18 is less than that of the cavity 12, and the length L of the glass plate 18 is greater than that of the cavity 12. Accordingly, the glass plate 8 is arranged so that a gap is formed between the sides of the glass plate 18 and the opposing walls of the vessel 11. The transparent resin in the cavity 12 is then hardened to form the resin layer 17. The package structure of FIG. 2 that protects the color filter of the chip 13 is obtained in this manner.

When the resin is hardened, contraction of the resin may produce internal stress. However, in such case, the resin located at the gaps is drawn inward thereby absorbing the stress. When thermal changes expand the resin layer 17, the resin expands out of the cavity 12 through the gaps. This prevents the application of excessive stress to the vessel 11 and the glass plate 18.

The preferred embodiment has the advantages described below.

Light having a relatively short wavelength (ultraviolet light) that causes deterioration of the color filter 19 is absorbed by the resin layer 17. Thus, such light does not reach the color filter 19. As a result, the color filter 19 is protected from light that causes deterioration, and discoloring of the color filter 19 is prevented. A solid-state image sensor having superior durability is therefore obtained.

Since the resin sealing the chip absorbs undesirable light, a filter for exclusively cutting out light of certain wavelengths is not needed. This decreases the fabrication cost of the solid-state image sensor and enables an inexpensive solid-state image sensor to be obtained.

In the preferred embodiment, a substantially scratchproof plate that allows the transmission of light (e.g., acrylic resin) may be used in lieu of the glass plate 18.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A package structure of a solid-state having a solid-state image sensor chip and a color filter stuck on a light receiving surface of the chip, the package structure comprising:
   a vessel for packaging the solid-state image sensor chip;
   an optically transparent protection plate attached to the vessel to cover the light receiving surface of the chip; and
   a resin layer arranged between the chip and the protection plate to absorb light having a wavelength shorter than the wavelength of visible light.

2. The package structure according to claim 1, wherein the vessel includes a cavity having a predetermined length and width to receive the chip, the protection plate having a length that is greater than the length of the cavity and a width that is less than the width of the cavity.

3. A solid-state image sensor comprising:
   a solid-state image sensor chip including a light receiving surface and a color filter stuck on the light receiving surface;
   a vessel including a cavity for receiving the chip;
   a resin layer arranged in the cavity to cover the color filter, wherein the resin layer absorbs light having a wavelength shorter than the wavelength of visible light; and
   a protection plate attached to the vessel to cover at least part of the resin layer.

4. The solid-state image sensor according to claim 3, wherein the cavity has a predetermined length and width, the protection plate having a length that is greater than the length of the cavity and a width that is less than the width of the cavity.

5. The solid-state image sensor according to claim 3, wherein the protection plate is fixed to the vessel so as to form a gap between the protection plate and the cavity, the resin layer being partially exposed by the gap.

* * * * *